(12) United States Patent
Zhang et al.

(10) Patent No.: US 11,616,030 B2
(45) Date of Patent: Mar. 28, 2023

(54) METHODS FOR MAKING THREE-DIMENSIONAL MODULE

(71) Applicant: Southern University of Science and Technology, ShenZhen (CN)

(72) Inventors: Guobiao Zhang, Corvallis, OR (US); Hongyu Yu, ShenZhen (CN); Shengming Zhou, ShenZhen (CN); Yuejin Guo, ShenZhen (CN); Kai Chen, ShenZhen (CN); Yida Li, ShenZhen (CN); Jun Lan, ShenZhen (CN)

(73) Assignee: Southern University of Science and Technology, GuangDong (CN)

( * ) Notice: Subject to any disclaimer, the term of this patent is extended or adjusted under 35 U.S.C. 154(b) by 0 days.

(21) Appl. No.: 17/539,040

(22) Filed: Nov. 30, 2021

(65) Prior Publication Data

US 2022/0084961 A1    Mar. 17, 2022

Related U.S. Application Data

(63) Continuation of application No. 16/926,606, filed on Jul. 10, 2020, now Pat. No. 11,217,542.

(30) Foreign Application Priority Data

Jul. 10, 2019  (CN) .......................... 201910619802.3

(51) Int. Cl.
*H01L 23/64* (2006.01)
*H01L 21/48* (2006.01)
*H01L 21/683* (2006.01)
*H01L 23/538* (2006.01)
*H01L 49/02* (2006.01)

(52) U.S. Cl.
CPC ........ *H01L 23/642* (2013.01); *H01L 21/4853* (2013.01); *H01L 21/4857* (2013.01); *H01L 21/6835* (2013.01); *H01L 23/5383* (2013.01); *H01L 23/5385* (2013.01); *H01L 23/5386* (2013.01); *H01L 23/5389* (2013.01); *H01L 28/92* (2013.01); *H01L 2221/68372* (2013.01)

(58) Field of Classification Search
CPC ............... H01L 23/642; H01L 21/4853; H01L 21/4857; H01L 21/6835; H01L 23/5383; H01L 23/5385; H01L 23/5386; H01L 23/5389; H01L 28/92; H01L 2221/68372; H01L 23/49822; H01L 2221/68345; H01L 2221/68359; H01G 4/12; H01G 4/304; H01G 4/232; C04B 35/64
USPC ......................................................... 257/532
See application file for complete search history.

(56) References Cited

U.S. PATENT DOCUMENTS

| | | |
|---|---|---|
| 3,988,651 A | 10/1976 | Hertz |
| 4,556,929 A | 12/1985 | Tanaka et al. |
| 4,809,130 A | 2/1989 | Chazono et al. |

(Continued)

*Primary Examiner* — Vu A Vu
(74) *Attorney, Agent, or Firm* — United States Research and Patent Firm; George G. Wang

(57) ABSTRACT

A method for making a three-dimensional (3-D) module includes the steps of: A) forming a laminate of alternate ceramic tape layers and internal electrode layers on a substrate; B) etching said laminate to form first and second capacitor stacks at said first and second locations; C) firing said first and second capacitor stacks integrally; D) forming first and second pairs of external electrodes on said first and second capacitor stacks, respectively.

10 Claims, 11 Drawing Sheets

(56) References Cited

U.S. PATENT DOCUMENTS

| | | | |
|---|---|---|---|
| 4,991,283 A | 2/1991 | Johnson et al. | |
| 5,195,019 A * | 3/1993 | Hertz | H01G 4/30 |
| | | | 29/25.42 |
| 5,315,239 A | 5/1994 | Vitriol | |
| 5,353,498 A | 10/1994 | Fillion et al. | |
| 5,384,434 A | 1/1995 | Mandai et al. | |
| 5,757,611 A | 5/1998 | Gurkovich et al. | |
| 5,841,193 A | 11/1998 | Eichelberger | |
| 6,011,683 A * | 1/2000 | Dat | H01G 4/306 |
| | | | 361/309 |
| 6,727,782 B2 * | 4/2004 | Sasaki | H03H 7/0115 |
| | | | 333/204 |
| 6,872,962 B1 | 3/2005 | Barratt | |
| 6,893,710 B2 | 5/2005 | Lee et al. | |
| 6,900,708 B2 | 5/2005 | White et al. | |
| 7,068,490 B2 * | 6/2006 | Prymak | H01G 2/065 |
| | | | 257/E23.079 |
| 7,166,493 B2 | 1/2007 | Dentry et al. | |
| 7,186,919 B2 * | 3/2007 | Kim | H05K 3/4623 |
| | | | 174/250 |
| 7,233,480 B2 * | 6/2007 | Hayashi | H01G 4/12 |
| | | | 361/321.1 |
| 7,805,834 B2 | 10/2010 | White et al. | |
| 7,911,801 B2 | 3/2011 | Iida et al. | |
| 7,989,895 B2 | 8/2011 | White et al. | |
| 8,040,657 B2 | 10/2011 | Hasegawa et al. | |
| 8,093,506 B2 * | 1/2012 | Kawabe | H01L 23/49822 |
| | | | 174/265 |
| 8,124,883 B2 * | 2/2012 | Chikagawa | C04B 35/63404 |
| | | | 174/250 |
| 8,304,854 B2 | 11/2012 | Lee et al. | |
| 8,369,064 B2 * | 2/2013 | Ichiyanagi | H05K 1/0231 |
| | | | 361/311 |
| 8,558,392 B2 | 10/2013 | Chua et al. | |
| 8,749,989 B1 | 6/2014 | Kaylei et al. | |
| 8,957,499 B2 | 2/2015 | Imanaka et al. | |
| 8,971,054 B2 * | 3/2015 | Fujidai | H05K 1/0271 |
| | | | 361/764 |
| 9,373,572 B2 | 6/2016 | Howard et al. | |
| 10,163,568 B2 | 12/2018 | Park et al. | |
| 10,176,924 B2 | 1/2019 | Lee et al. | |
| 10,181,410 B2 | 1/2019 | Song et al. | |
| 2006/0234022 A1 * | 10/2006 | Liu | H01G 4/2325 |
| | | | 361/306.3 |

* cited by examiner

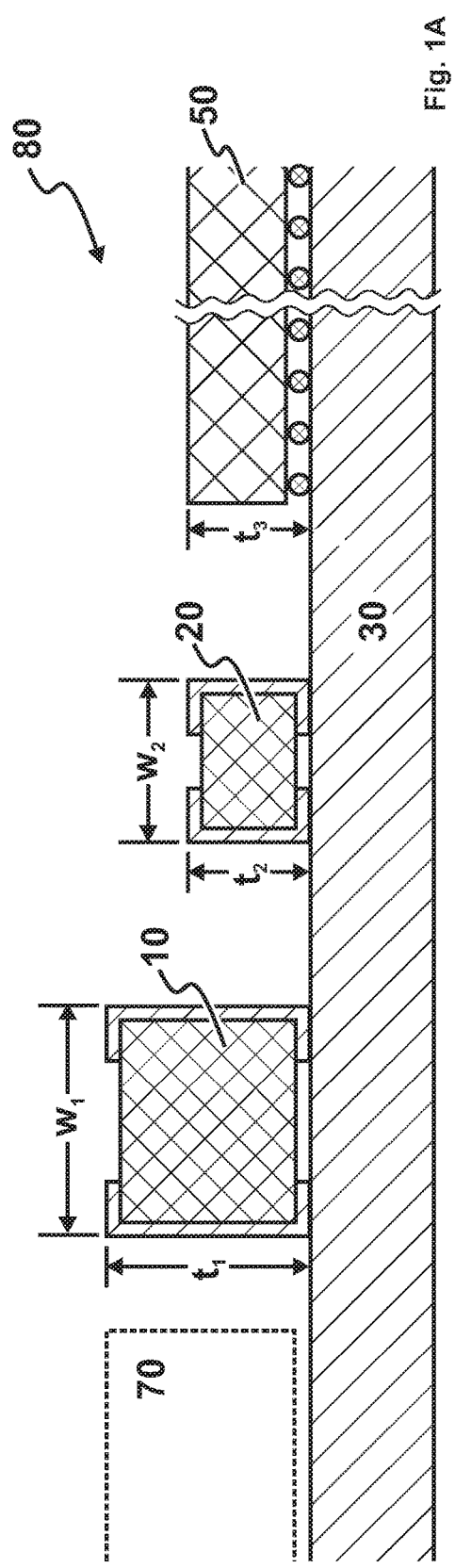
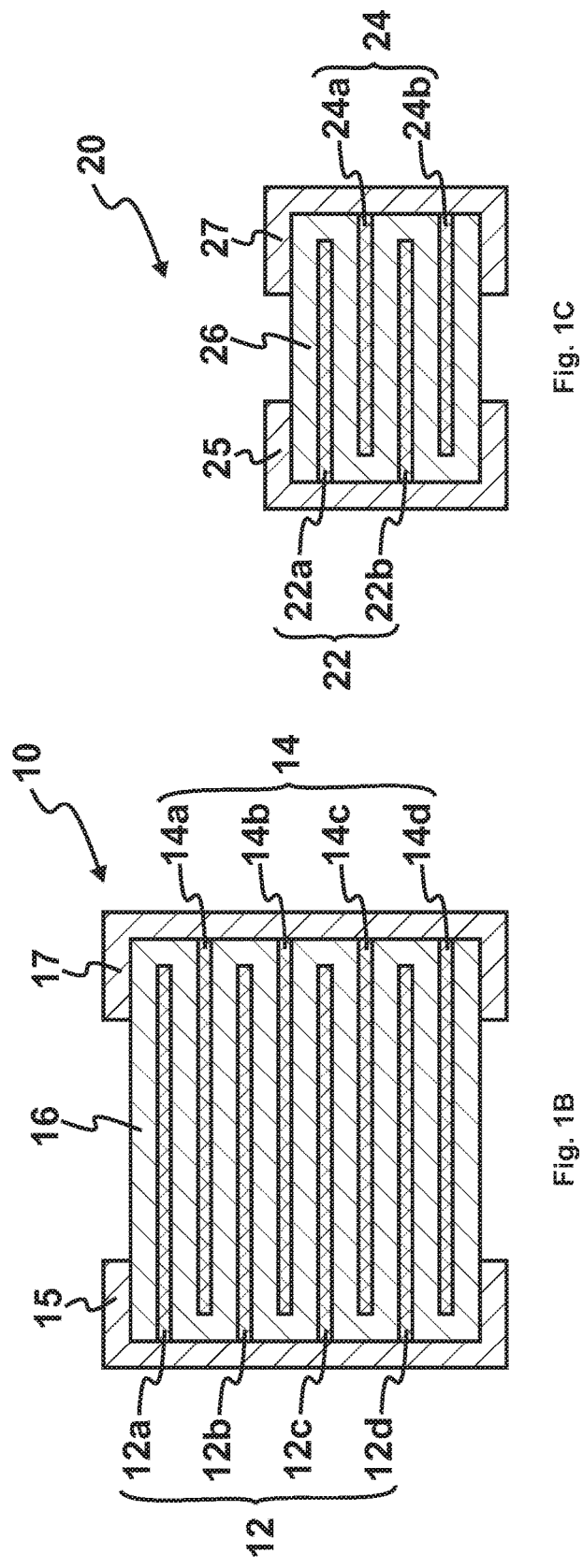

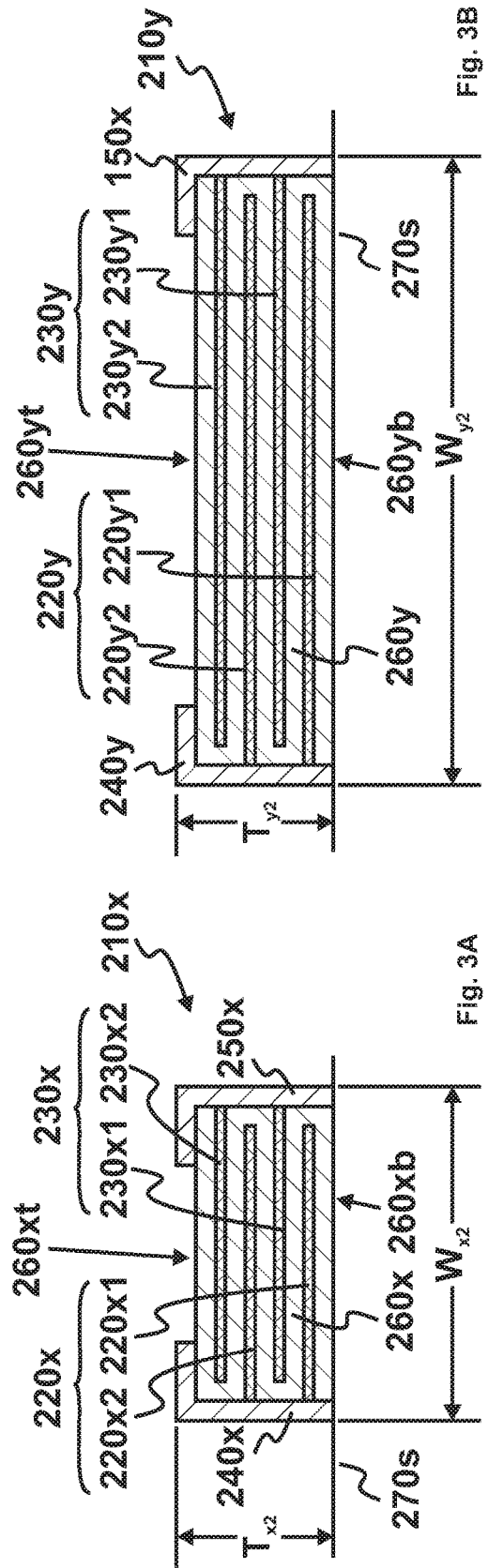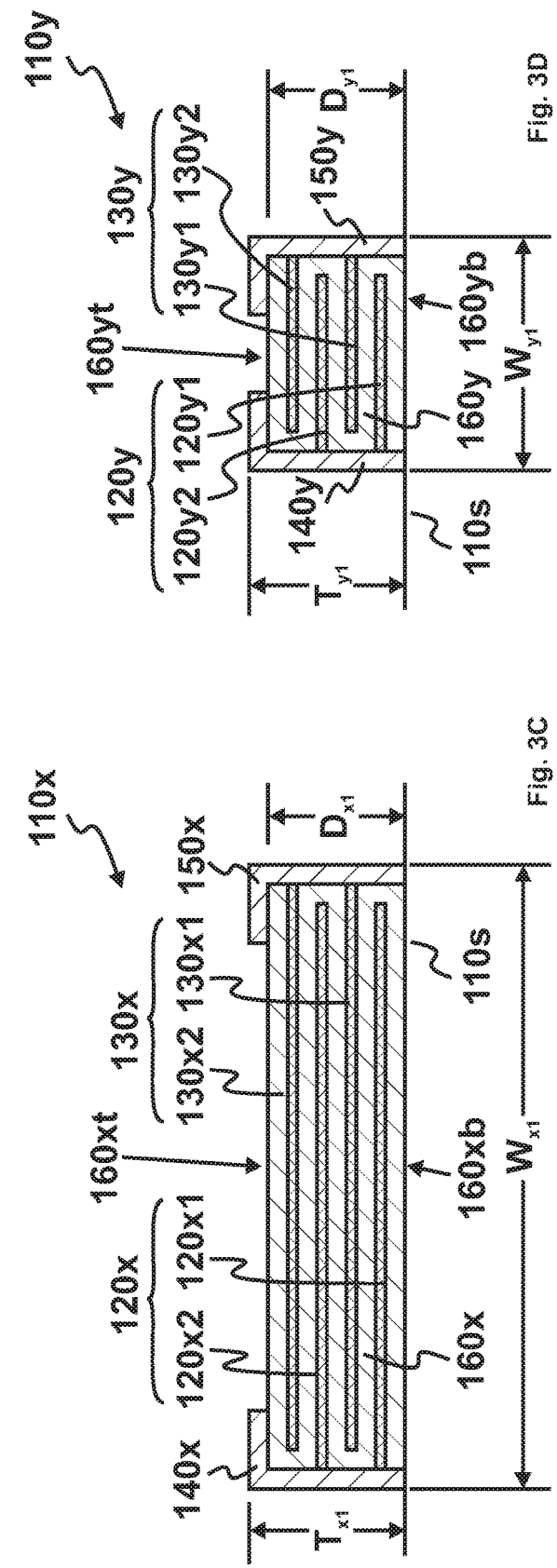

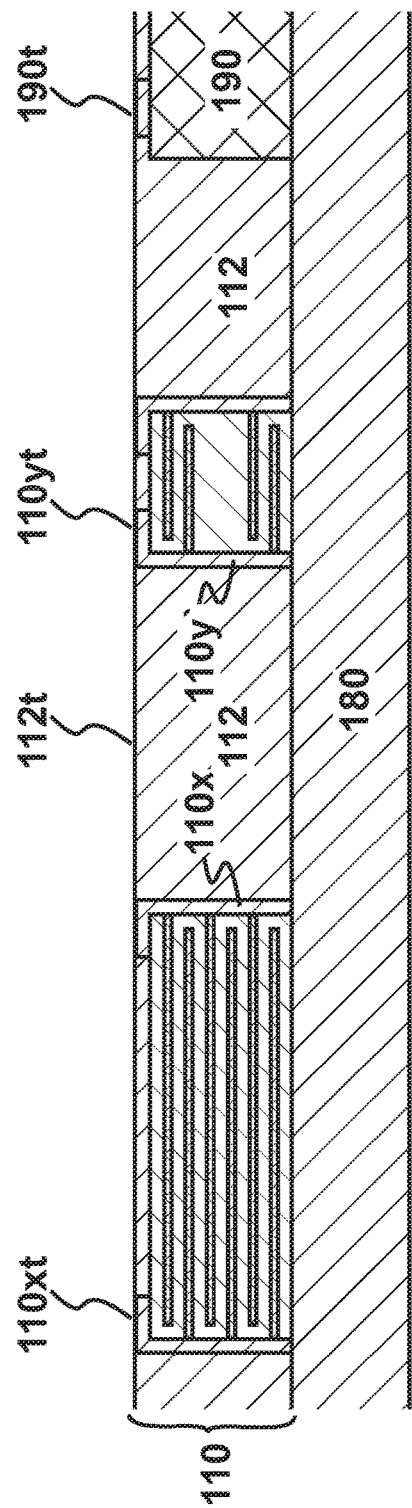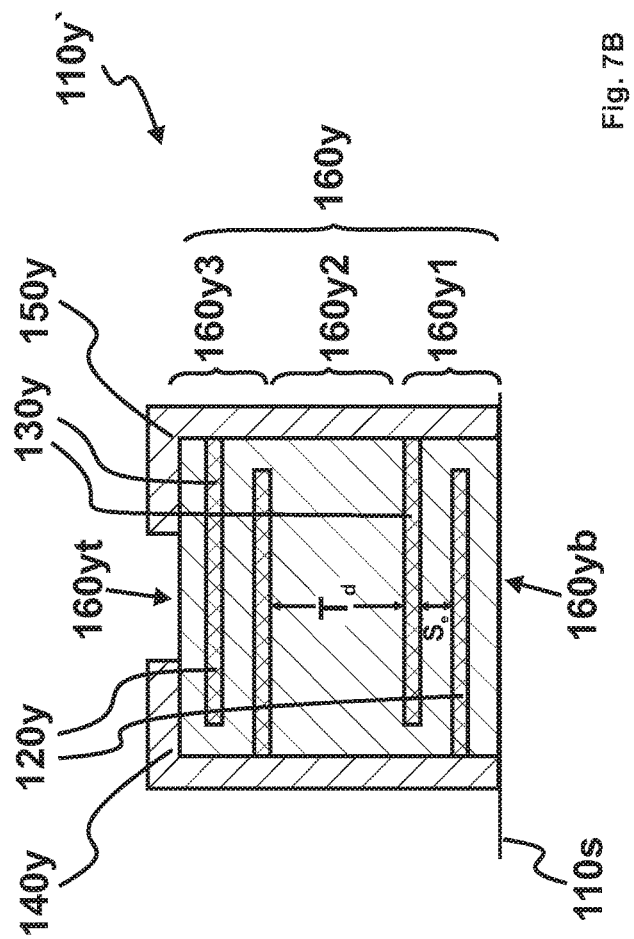

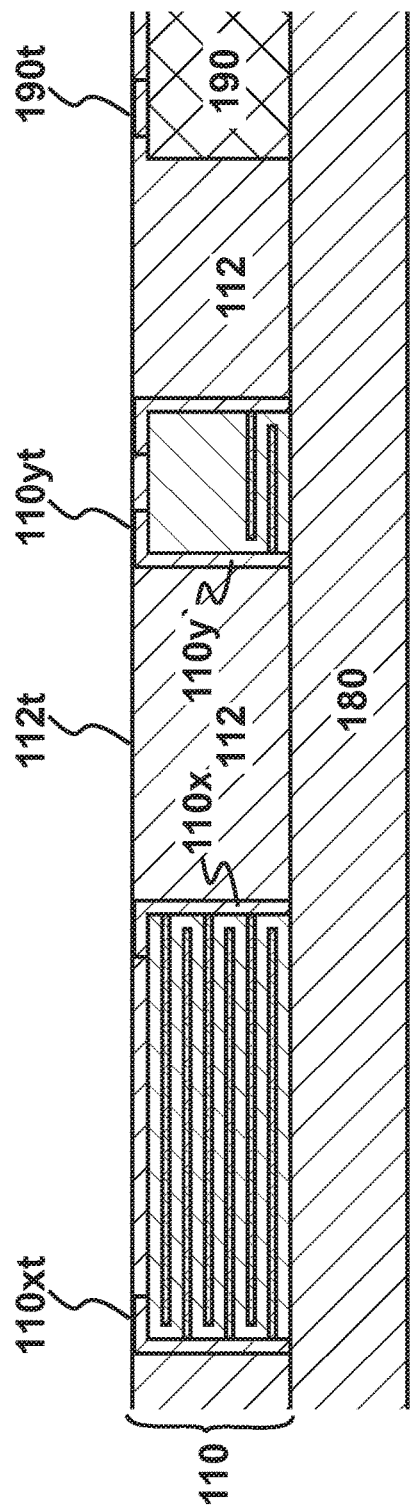
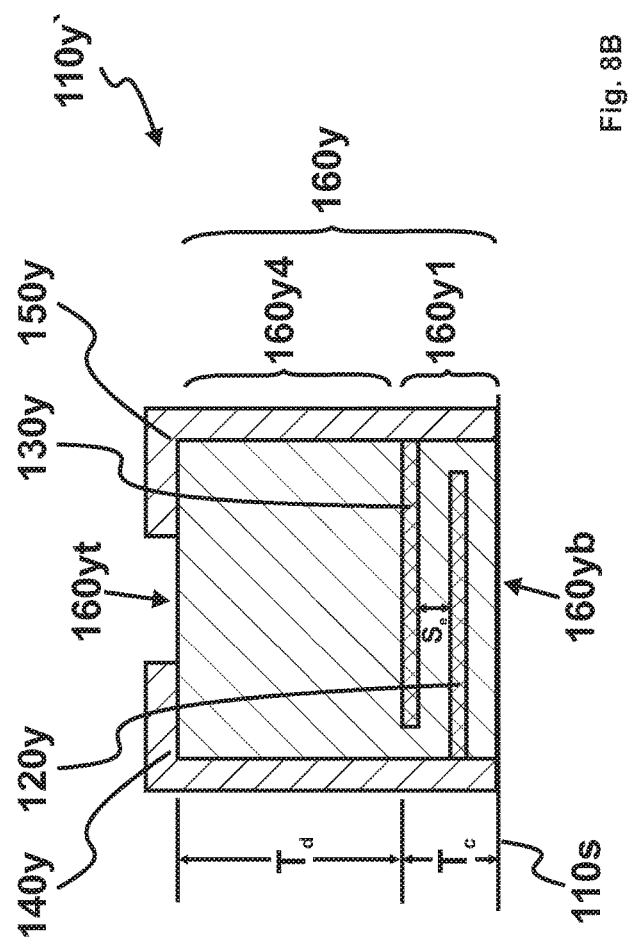

METHODS FOR MAKING THREE-DIMENSIONAL MODULE

CROSS-REFERENCE TO RELATED APPLICATIONS

This application is a continuation of U.S. patent application Ser. No. 16/926,606, filed Jul. 10, 2020, which claims priorities from Chinese Patent Application No. 201910619802.3, filed Jul. 10, 2019, in the State Intellectual Property Office of the People's Republic of China (CN), the disclosure of which is incorporated herein by references in its entirety.

BACKGROUND

1. Technical Field of the Invention

The present invention relates to the field of integrated circuits, and more particularly to a compact multilayer electronic module comprising separately fired layers with different electrical characteristics.

2. Prior Art

Multilayer ceramic capacitors (MLCC) have been widely used electronic modules. FIG. 1A discloses an electronic module 80 using MLCCs. It comprises a module substrate 30, at least an integrated circuit (IC) die 50 and a plurality of capacitors, including a large capacitor 10 and a small capacitor 20. The module substrate 30 comprises interconnects communicatively coupling the IC die 50 and the capacitors 10, 20. In a typical circuit, the capacitance values of the capacitors 10, 20 have a wide range, e.g. from tens of pico-Farad (pF) to hundreds of nano-Farad (nF), even to micro-Farads (uF). Generally speaking, the largest capacitor is at least ten times larger in capacitance value than the smallest capacitor. In some cases, this difference could be at least one hundred times. In extreme cases, this difference could be even at least one thousand times.

Details of the large capacitor 10 are further disclosed in FIG. 1B. It has a thickness of $t_1$ and a dimension of $w_1$. It further comprises a ceramic body 16 including a plurality of high-k dielectric layers, two external electrodes 15, 17 covering at least one surface of the ceramic body 16, and two sets of internal electrodes 12, 14 separating the high-k dielectric layers. The first set of internal electrodes 12 shifts to the left with respect to the second set of internal electrodes 14. The first set of internal electrodes 12, including four left internal electrodes 12a-12d, interleave the second set of internal electrodes 14, including four right internal electrodes 14a-14d. The first set of internal electrodes 12 are electrically coupled with the external electrode 15, whereas the second set of internal electrodes 14 are electrically coupled with the external electrode 17.

Details of the small capacitor 20 are disclosed in FIG. 1C. It has a thickness of $t_2$ and a dimension of $w_2$. It also comprises a ceramic body 26 and two external electrodes 25, 27. Having a substantially smaller capacitance value than the large capacitor 10, its first set of internal electrodes 22 includes only two left internal electrodes 22a-22b, and its second set of internal electrodes 24 includes only two right internal electrodes 24a-24b.

Although they are monolithic capacitors per se, i.e. all high-k dielectric layers and all internal electrode layers are fired together in a single firing step, the capacitors 10, 20 are still discrete components. To be installed into an electronic module, these capacitors 10, 20 need to be individually picked up by a robot arm and placed at predetermined locations on the module substrate 30. When an electronic module 80 contains a large number of capacitor, this installation process becomes time-consuming and costly.

A conventional electronic module 80 typically uses pre-fabricated, general-purpose capacitors 10, 20. For a small capacitor 20 with capacitance value ranging from pF's to nF's, the thickness $t_2$ of the capacitor 20 is generally in sub-millimeter, which is acceptable to mobile applications. However, for a large capacitor 10 with capacitance value of uF's, because it comprises hundreds of high-k dielectric layers and internal electrode layers, the thickness $t_1$ of the capacitor 10 is on the order of millimeters (e.g. ~5 mm). This is much larger than the thickness $t_3$ of the IC die 50 and therefore, too much for mobile applications.

To reduce the footprint of an electronic module, it is preferred to integrate passive components into a multilayer module. High-temperature co-fired ceramic (HTCC) and low-temperature co-fired ceramic (LTCC) have been developed to meet this requirement. More particularly, LTCC makes it possible to use highly conductive metal materials (such as aluminum, copper, silver, gold, etc.) for the metal electrodes. However, LTCC comes at a cost: the k-value of the LTCC is ~20, a little low for the industry.

Objects and Advantages

It is a principle object of the present invention to provide a compact electronic module with a high performance.

It is a further object of the present invention to reduce the installation time and lower the installation cost of passive components.

It is a further object of the present invention to reduce the thickness of an electronic module comprising passive components.

It is a further object of the present invention to improve the quality of the dielectric material in the passive components.

It is a further object of the present invention to improve the speed of interconnects coupling passive components.

It is a further object of the present invention to increase the capacitance range of the MLCC capacitors.

In accordance with these and other objects of the present invention, the present invention discloses a three-dimensional (3-D) module with integrated passive components.

SUMMARY OF THE INVENTION

The present invention discloses a three-dimensional (3-D) module with integrated passive components. The preferred 3-D module comprises a plurality of device levels interposed by interconnect levels. Each device level includes a plurality of passive components comprising at least one layer of a high-k dielectric material, typically a ceramic material; whereas, each interconnect level comprises at least one layer of a low-k dielectric material, typically an organic material. By integrally firing the passive components on each device level, the installation time of the passive components is reduced and the installation cost thereof is lowered. On the other hand, by independently firing each device level and each interconnect level, the preferred 3-D module has a better performance than both high-temperature co-fired ceramic (HTCC) and low-temperature co-fired ceramic (LTCC) structures.

Firings of a preferred 3-D module include both integral firing and independent firing. This is different from the HTCC/LTCC structures. The HTCC/LTCC uses only integral firing, i.e. all device and interconnect levels are fired in a single firing step. However, for the preferred 3-D module, each device level and each interconnect level are fired independently. With independent firing, the high-k dielectric (e.g. ceramic) material could be fired at a high firing temperature (e.g. ~15000 C) and therefore, have a larger dielectric constant and a better quality factor than that of the LTCC. On the other hand, because the low-k dielectric (e.g. organic) material of the present invention could be fired at a low firing temperature (e.g. ~2000 C), the interconnect levels of the present invention may comprise highly conductive materials such as aluminum, copper, silver, gold and alloys thereof. As a result, the interconnect level of the preferred 3-D module is faster than that of the HTCC.

On the other hand, the passive components on each device level are fired integrally, i.e. they are fired as a monolithic structure during a single firing step. Because the passive components on each device level are formed together at predetermined locations on a ceramic substrate, these passive components can be installed as a whole. Since no installation of individual passive components is required, the installation time and the installation cost of the passive components can be significantly reduced. The integrally fired MLCC capacitors comprise the same high-k dielectric material and have the same thickness. Namely, their top surfaces and bottom surfaces are co-planar, respectively.

Accordingly, the present invention discloses a three-dimensional (3-D) module, comprising: a first device level including a plurality of passive components fired integrally and comprising at least one layer of a first high-k dielectric material; an interconnect level on said first device level for coupling said passive components, comprising at least one layer of a low-k dielectric material; a second device level on said interconnect level, including another plurality of passive components fired integrally and comprising at least one layer of a second high-k dielectric material; inter-level connections for communicatively coupling said first and second device levels; wherein said first and second high-k dielectric materials are fired independently; and, said first and second high-k dielectric materials have substantially higher firing temperatures than said low-k dielectric material.

The present invention further discloses another 3-D module, comprising: a first device level comprising devices including first and second capacitors with substantially different capacitance values, wherein said first and second capacitors comprise a same first high-k dielectric material with a same thickness; an interconnect level on said first device level for communicatively coupling said devices in said first device level, comprising at least one layer of low-k dielectric material and at least one layer of conductive material; a second device level on said interconnect level, including a plurality of passive components comprising at least one layer of a second high-k dielectric material; inter-level connections for communicatively coupling said first and second device levels; wherein said first and second high-k dielectric materials are fired independently; and, said first and second high-k dielectric materials have substantially higher firing temperatures than said low-k dielectric material.

In order to increase the capacitance range (i.e. the capacitance ratio between the largest and smallest capacitance values) of the MLCC capacitors on a device level, besides varying the capacitor's physical dimensions, the number of the capacitor's internal electrodes can also be varied. For example, the MLCC capacitor with the largest capacitance value comprises a full set of internal electrodes, i.e. its number of internal electrodes is the maximum allowable number for the ceramic body; however, the MLCC capacitor with the smallest capacitance value does not comprise a full set of internal electrodes, i.e. its number of internal electrodes is smaller than the maximum allowable number for the ceramic body. Namely, its ceramic body comprises at least a capacitive portion and a dummy portion, wherein the capacitive portion comprises internal electrodes, but the dummy portion comprises no internal electrodes.

Accordingly, the present invention discloses an MLCC capacitor including first and second external electrodes, comprising: a ceramic body comprising a capacitive portion and a dummy portion; a plurality of internal electrodes extending from said first and second external electrode into said capacitive portion in an interleaving manner; wherein said dummy portion does not comprise any internal electrode; the thickness of said dummy portion is at least twice as much as the largest distance between adjacent ones of said internal electrodes in said capacitive portion.

BRIEF DESCRIPTION OF THE DRAWINGS

FIG. 1A is a cross-sectional view of an electronic module 80 with two capacitors 10, 20 (prior art); FIG. 1B is a cross-sectional view of a large capacitor 10; FIG. 1C is a cross-sectional view of a small capacitor 20.

FIGS. 3A-3D are cross-sectional views of four MLCC capacitors in the first preferred 3-D module.

FIG. 7A is a cross-sectional view of a first preferred device level with two capacitors with a substantially difference in capacitance values; FIG. 7B is a cross-sectional view of a first preferred capacitor with a first dummy ceramic portion.

FIG. 8A is a cross-sectional view of a second preferred device level with two capacitors with a substantially difference in capacitance values; FIG. 8B is a cross-sectional view of a second preferred capacitor with a second dummy ceramic portion.

Figure 2:
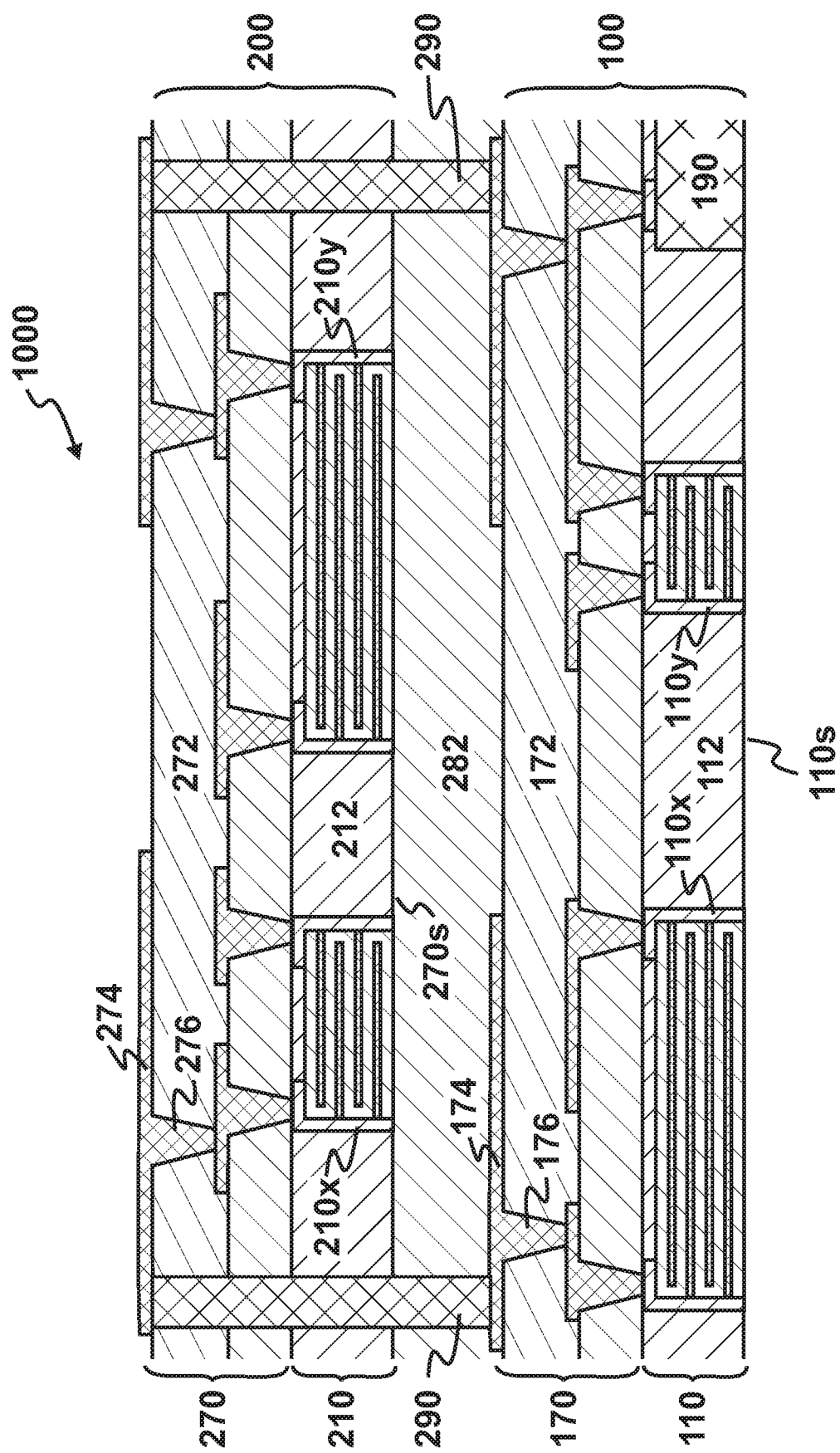
FIG. 2 is a cross-sectional view of a first preferred three-dimensional (3-D) module.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The symbol "I" means a relationship of "and" or "or".

Throughout this specification, the phrase "firing" means a high-temperature process to finalize the material form of a dielectric. In the context of a ceramic material, "firing" is referred to as sintering; and "firing temperature" is the highest processing temperature before a ceramic material is finalized. In the context of an organic material, "firing" is referred to as curing (or, annealing); and "firing temperature" is the highest processing temperature before an organic material is finalized.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention discloses a three-dimensional (3-D) module with integrated passive components. The preferred 3-D module comprises a plurality of device levels interposed by interconnect levels. Each device level includes a plurality of passive components comprising at least one layer of a high-k dielectric material, typically a ceramic material; whereas, each interconnect level comprises at least one layer of a low-k dielectric material, typically an organic material. By integrally firing the passive components on each device level, the installation time of the passive components is reduced and the installation cost thereof is lowered. On the other hand, by independently firing each device level and each interconnect level, the preferred 3-D module has a better performance than both low-temperature co-fired ceramic (LTCC) and high-temperature co-fired ceramic (HTCC) structures.

Referring now to FIG. 2 of the present invention, a first preferred 3-D module 1000 is disclosed. It includes two vertically stacked sub-modules 100, 200. The first sub-module 100 comprises a first device level 110 and a first interconnect level 170. The first device level 110 includes a plurality of devices such as two MLCC capacitors 110x, 110y and an IC die 190. These devices are surrounded and mechanically interconnected by a first structural material 112. The first interconnect level 170 is disposed on the first device level 110. It includes a plurality of first dielectric layers 172, first metallization layers 174, first inter-layer vias 176 for electrically coupling first metallization layers 174.

Similarly, the second sub-module 200 comprises a second device level 210 and a second interconnect level 270. The second device level 210 includes a plurality of devices such as two MLCC capacitors 210x, 210y. These devices 210x, 210y are surrounded and mechanically interconnected by a second structural material 212. The second interconnect level 270 on the second device level 210 includes a plurality of second dielectric layers 272, second metallization layers 274, and second inter-layer vias 176.

The first and second sub-modules 100, 200 are communicatively coupled by a plurality of inter-level connections 290. In this preferred embodiment, the inter-level connections 290 are vias, e.g. through-silicon vias (TSV) widely used in 3-D packaging.

FIGS. 3A-3D disclose more details of the MLCC capacitors in FIG. 2, including two MLCC capacitors 110x, 110y in the first device level 100 and two MLCC capacitors 210x, 210y in the second device level 200. For example, the MLCC capacitor 110x includes a ceramic body 160x, two sets of internal electrodes 120x, 120y, and a pair of external electrodes 140x, 140y. The ceramic body 160x has a bottom surface 160xb (coinciding with the bottom surface 110s of the device level 110) and a top surface 160xt. It has a thickness of $D_{x1}$. The first set of internal electrodes 120x as a whole is shifted to the left with respect to the second set of internal electrodes 130x. It includes two internal electrodes 120x1, 120x2, which are parallel to each other and electrically coupled to the first external electrode 140x. Similarly, the two internal electrodes 130x1, 130x2 of the second set 130x are electrically coupled to the second external electrode 150x. Overall, the MLCC capacitor 110x has a thickness of $T_{x1}$ and a dimension of $W_{x1}$.

Figure 4A:
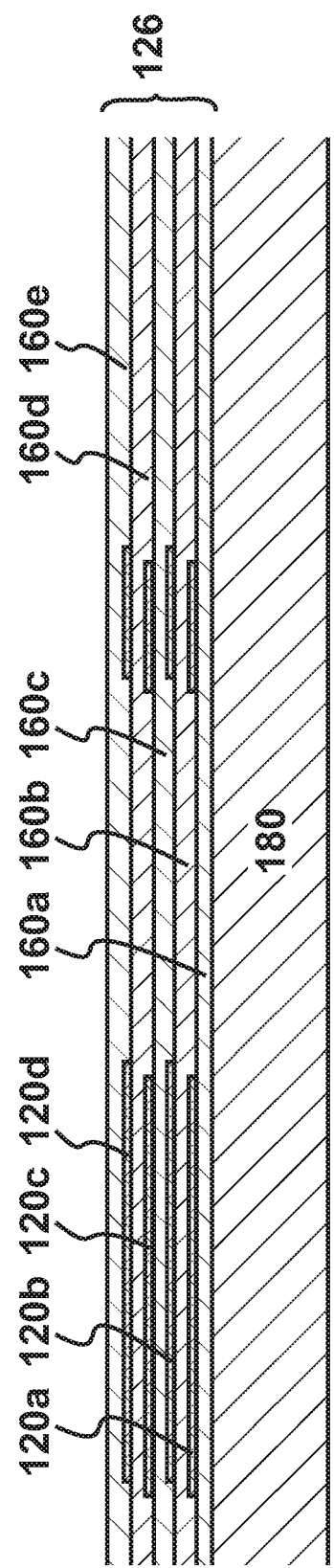
FIGS. 4A-4H illustrate the process flow of the first preferred 3-D module at various processing steps.

Referring now to FIGS. 4A-4H of the present invention, a process flow to manufacture the first preferred 3-D module is disclosed. First of all, a plurality of ceramic "green" tape layers 160*a*-160*e* and internal electrode layers 120*a*-120*d* are laminated in an alternating manner to form a laminate 126 on a ceramic substrate 180 (FIG. 4A). Note that the internal electrode layers 120*a*-120*d* carry the patterns of the internal electrodes 120x1, 120x2, 120y1 and 120y2 (FIG. 3C) at the locations of the MLCC capacitors 110x, 110y. The ceramic substrate 180 is a rigid and dimensionally stable substrate.

Figure 4B:
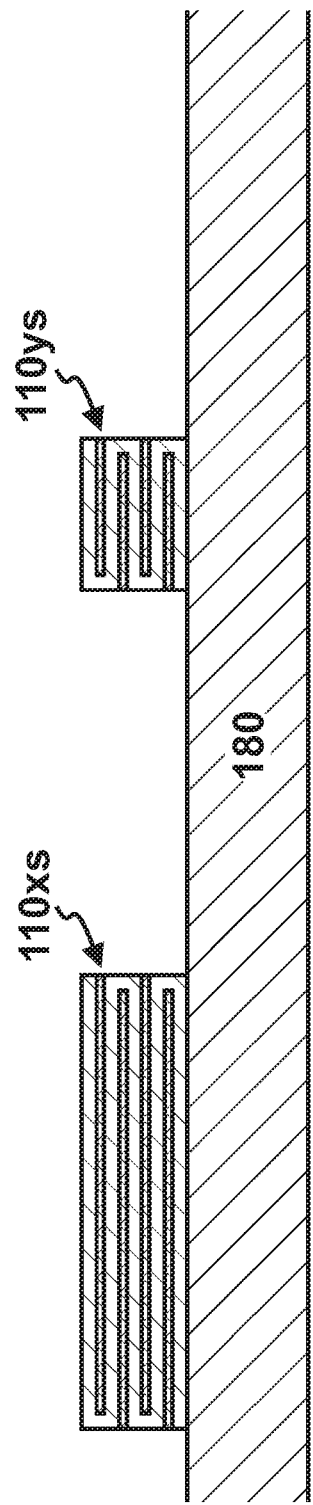

Next, the laminate 126 is etched to form capacitor stacks 110xs, 110ys associated with the MLCC capacitors 110x, 110y (FIG. 4B). The capacitor stacks 110xs, 110ys, carried on the ceramic substrate 180, are then fired integrally, i.e. fired together in a single firing step. For the ceramic "green" tape layers 160*a*-160*e*, this firing processing is referred to as sintering. Because the capacitor stacks 110xs, 110ys and the ceramic substrate 180 only comprise high-temperature materials and the sintering temperature could be as high as ~15000 C, the sintered ceramic materials could have a large dielectric constant and a good quality (Q) factor. As the ceramic substrate 180 is dimensionally stable during firing, the capacitor stacks 110xs, 110ys would remain at the same locations after the firing step. This would facilitate future alignments between the device level 110 and the interconnect level 170, as well as alignment between sub-modules 100, 200.

Figure 4C:
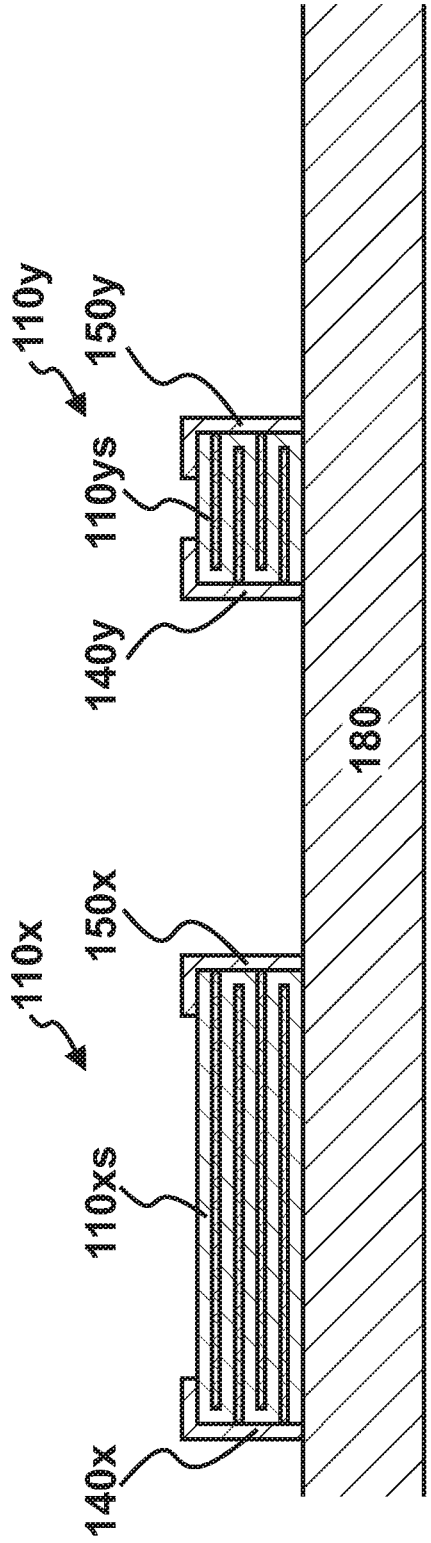
Figure 4D:
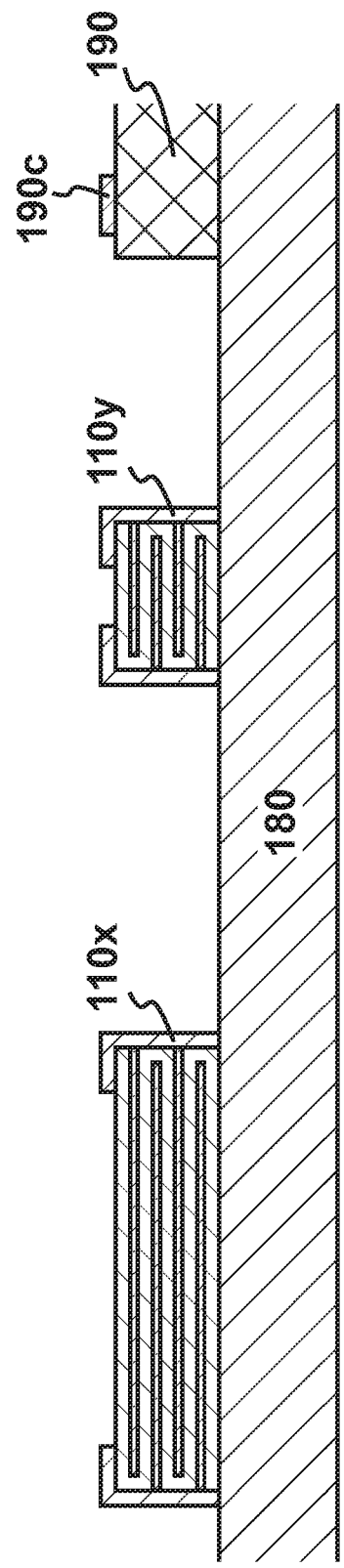
Figure 4E:
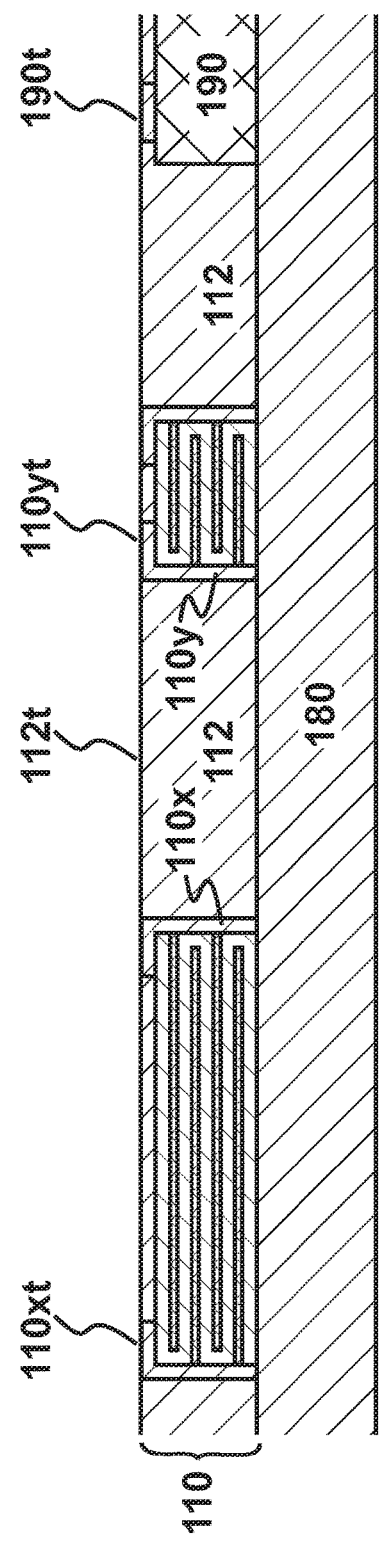

After the sintering step, a first pair of external electrodes 140x, 150x are formed on the capacitor stack 110xs, and a second pair of external electrodes 140y, 150y are formed on the capacitor stack 110ys (FIG. 4C). Optionally, an IC die 190 with a contact pad 190c is also mounted on the surface of the ceramic substrate 180 (FIG. 4D). A structural material 112 is deposited around the capacitors 110x, 110y and the IC die 190 and then planarized in such a way that the top surfaces 110xt, 110yt of the capacitors 110x, 110y, the top surface 190t of the IC die 190, and the top surface 112t of the structural material 112 are co-planar (FIG. 4E). Preferably, the structural material 112 is a low-k dielectric material.

Figure 4F:
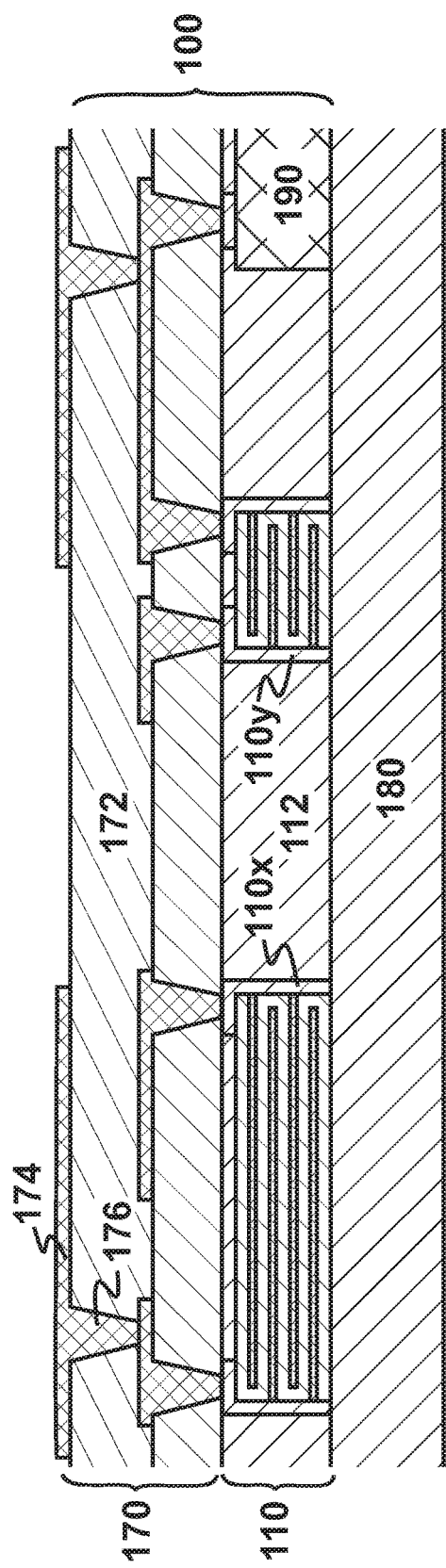

The formation of the structural material 112 concludes the formation of the first device level 110. Then the first interconnect level 170 is formed on the first device level 110 (FIG. 4F). The first interconnect level 170 comprises first dielectric layers 172, first metallization layers 174, and first inter-layer vias 176. The first dielectric layers 172 preferably comprise a low-k dielectric material, typically an organic material. In general, the organic material needs to go through a firing process before its material form is finalized. This firing process for the organic material is referred to as curing. Since the curing temperature of the organic material could be as low as ~200° C. the metallization layers 174 could use highly conductive materials such as aluminum, copper, silver, gold and alloys thereof. Since curing of the organic material in the interconnect level 170 and sintering of the ceramic material in the device level 110 are two separate steps, the interconnect level 170 and the device level 110 are said to be "fired independently" in the present invention.

Figure 4G:
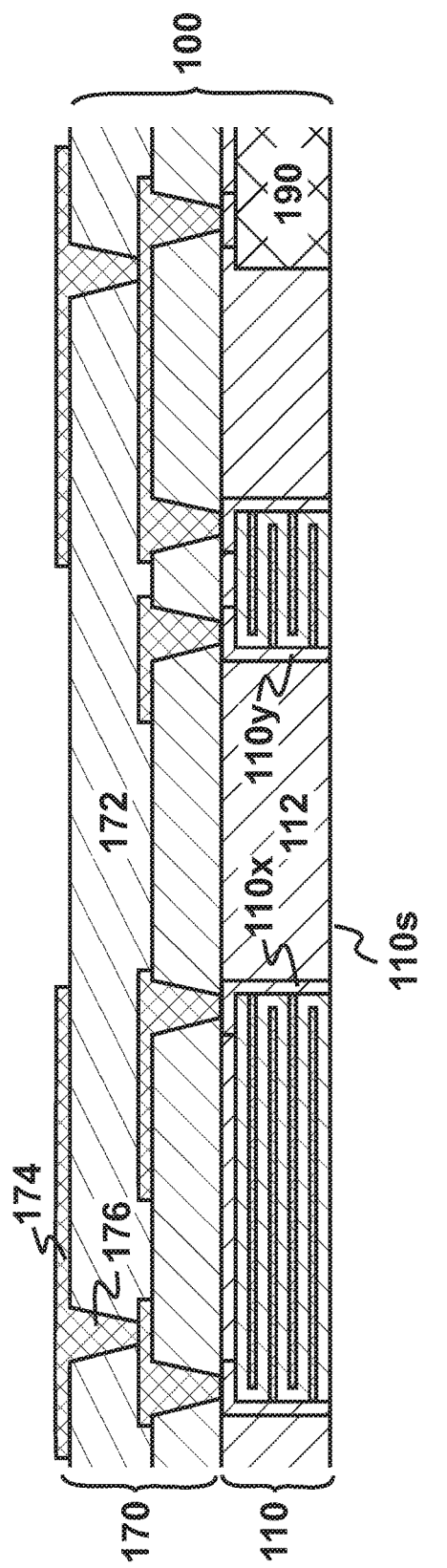

Since the structural material 112 mechanically interconnects the MLCC capacitors 110x, 110y and the IC die 190, the ceramic substrate 180 is no longer needed to provide mechanical support and fix the locations of these devices. As a result, the ceramic substrate 180 could be removed (FIG. 4G). At this time, the bottom surface 110s of the device level 110 is exposed.

Figure 4H:
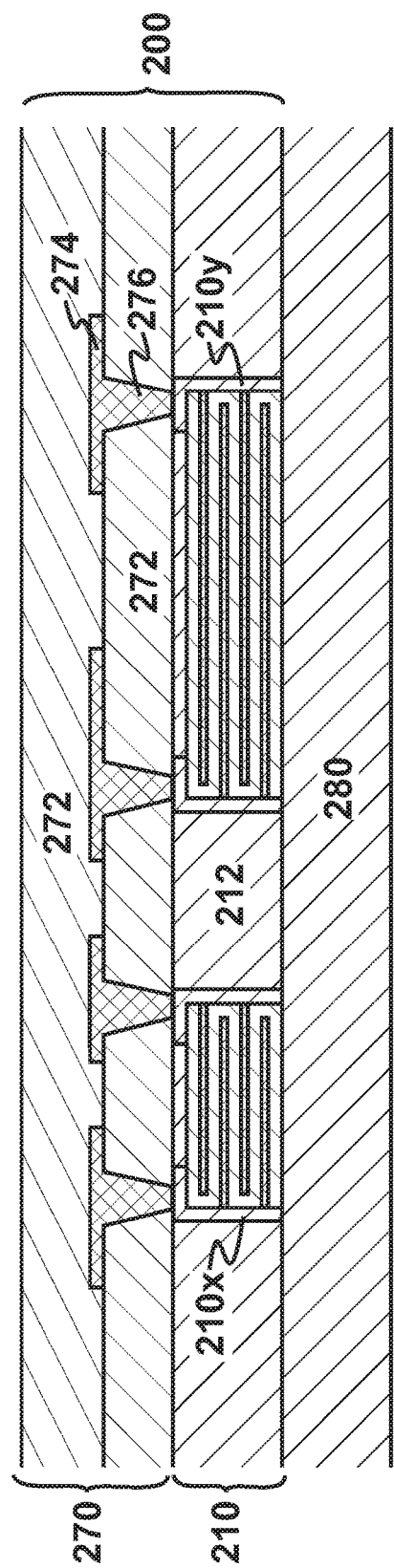

While the first sub-module 100 is being manufactured, the second sub-module 200 can be manufactured independently (FIG. 4H). For example, although the MLCC capacitors 210$x$, 210$y$ can be sintered together with the MLCC capacitors 110$x$, 110$y$, the MLCC capacitor 210$x$, 210$y$ are sintered as a separate monolithic structure from the MLCC capacitors 110$x$, 110$y$. To be more specific, the MLCC capacitors 210$x$, 210$y$ are sintered as a monolithic structure on the ceramic substrate 280, while the MLCC capacitors 110$x$, 110$y$ are sintered as another monolithic structure on the ceramic substrate 180. It should be apparent to those skilled in the art that the ceramic substrate 280 can be removed after the structural material 212 are formed.

Finally, the first and second sub-modules 100, 200 are vertically stacked via a glue layer 282 (FIG. 2). The sub-modules 100, 200 are electrically coupled though inter-level connections 290.

From the above description, firings of the preferred 3-D module 1000 include both integral firing and independent firing. This is different from the HTCC/LTCC structures. The HTCC/LTCC uses only integral firing, i.e. all device and interconnect levels are fired in a single firing step. However, for the preferred 3-D module 1000, all device and interconnect levels are fired independently. With independent firing, the high-k dielectric (e.g. ceramic) material could be fired at a high firing temperature (e.g. ~1500° C.) and therefore, have a larger dielectric constant and a better quality factor than that of the LTCC. On the other hand, because the low-k dielectric (e.g. organic) material of the present invention could be fired at a low firing temperature (e.g. ~200° C.), the interconnect levels of the present invention may comprise highly conductive materials such as aluminum, copper, silver, gold and alloys thereof. As a result, the interconnect level of the preferred 3-D module is faster than that of the HTCC.

On the other hand, the passive components on each device level are fired integrally, i.e. they are fired as a monolithic structure during a single firing step. Because the passive components on each device level are formed together at predetermined locations on a ceramic substrate, these passive components can be installed as a whole. Since no installation of individual passive components is required, the installation time and the installation cost of the passive components can be significantly reduced. The integrally fired MLCC capacitors comprise the same high-k dielectric material and have the same thickness. Namely, their top surfaces and bottom surfaces are co-planar, respectively.

Figure 5:
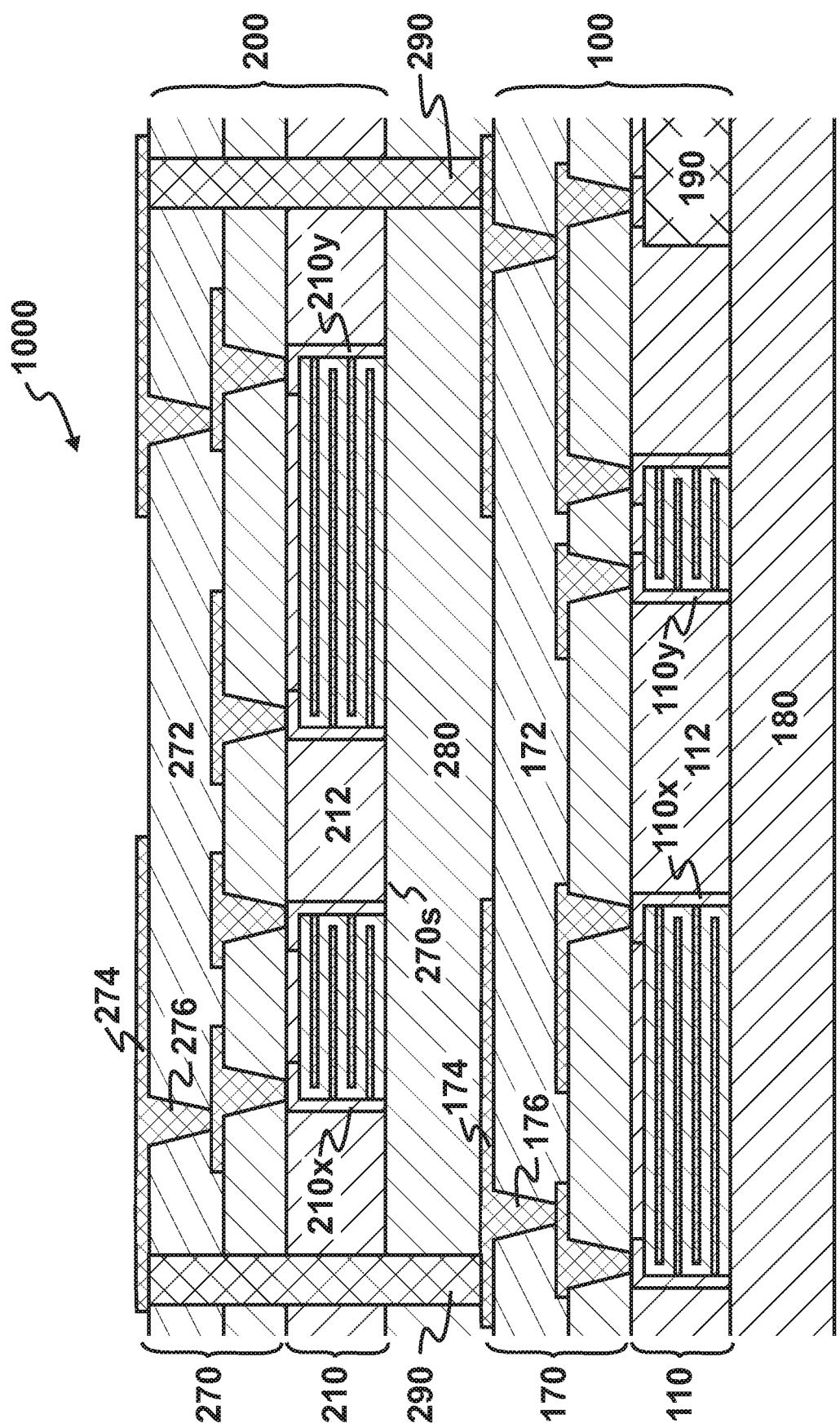
FIG. 5 is a cross-sectional view of a second preferred 3-D module.

Referring now to FIG. 5, a second preferred 3-D module 1000 is disclosed. In this preferred embodiment, the ceramic substrates 180, 280 of the device levels 110, 210 remain in the sub-modules 100, 200. The existence of the ceramic substrates 180, 280 can prevent the shrinkage of the device levels 110, 210.

Figure 6:
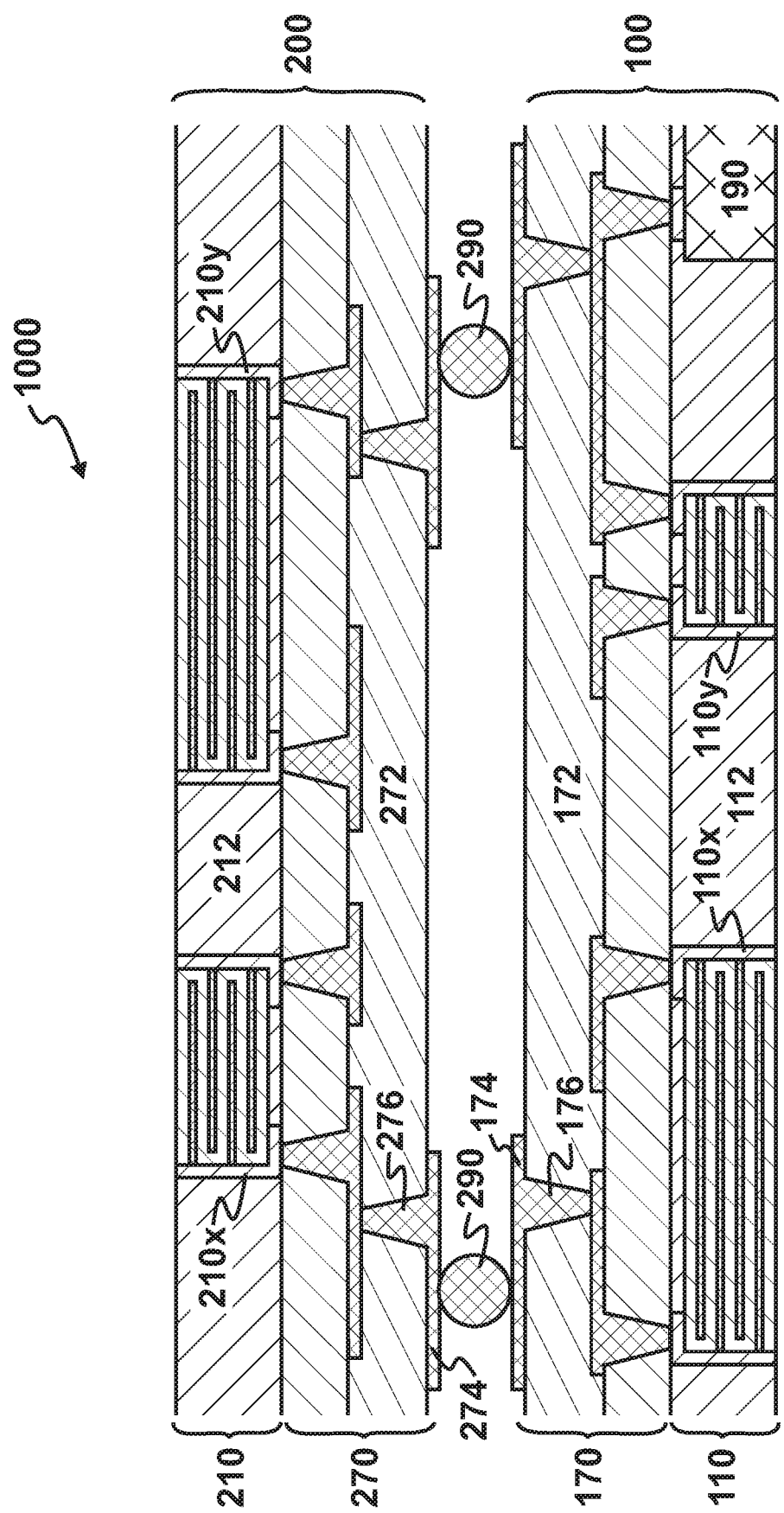
FIG. 6 is a cross-sectional view of a third preferred 3-D module.

Referring now to FIG. 6, a third preferred 3-D module 1000 is disclosed. In this preferred embodiment, the second sub-module 200 is flipped and makes contact with the first sub-module 100 face-to-face. Bumps (e.g. micro-bumps) 290 provide inter-level connections between the sub-modules 100, 200.

In order to increase the capacitance range (i.e. the capacitance ratio between the largest and smallest capacitance values) of the MLCC capacitors 110$x$, 110$y$ on a device level 110, besides varying the capacitor's physical dimensions, the number of the capacitor's internal electrodes can also be varied. For example, the MLCC capacitor with the largest capacitance value comprises a full set of internal electrodes, i.e. its number of internal electrodes is the maximum allowable number for the ceramic body; however, the MLCC capacitor with the smallest capacitance value does not comprise a full set of internal electrodes, i.e. its number of internal electrodes is smaller than the maximum allowable number for the ceramic body. Namely, the ceramic body comprises at least a capacitive portion and a dummy portion, wherein the capacitive portion comprises internal electrodes, but the dummy portion comprises no internal electrodes.

Referring now to FIGS. 7A-7B, a first preferred device level 110 (FIG. 7A) and a first preferred small capacitor 110$y$ (FIG. 7B) are shown. Although the large capacitor 110$x$ comprises a full set of internal electrodes, the small capacitor 110$y'$ does not comprise a full set of internal electrodes. In comparison, both MLCC capacitors 110$x$, 110$y$ in FIG. 4B comprise full set of internal electrode.

In this preferred embodiment, the ceramic body 160$y$ of the small capacitor 110$y'$ comprises two capacitive portions 160$y$1, 160$y$3 and one dummy portion 160$y$2. Each of the capacitive portions 160$y$1, 160$y$3 comprises two internal electrodes 120$y$, 130$y$. The thickness $T_d$ of the dummy portion 160$y$2 is at least twice as much as the spacing $S_e$ between adjacent internal electrodes 120$y$, 130$y$.

Referring now to FIGS. 8A-8B, a second preferred device level 110 (FIG. 8A) and a first preferred small capacitor 110$y$ (FIG. 8B) are shown. In this preferred embodiment, the ceramic body 160$y$ of the small capacitor 110$y'$ comprises a capacitive portion 160$y$1 and a dummy portion 160$y$4. The capacitive portion 160$y$1 comprises two internal electrodes 120$y$, 130$y$. The thickness $T_d$ of the dummy portion 160$y$4 is more than the thickness $T_c$ of the capacitive portion 160$y$1.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A method for making a three-dimensional (3-D) module including first and second capacitors at first and second locations on a substrate, comprising the steps of:
    A) forming a first laminate of alternate ceramic tape layers and internal electrode layers at said first and second locations on said substrate;
    B) forming a second laminate of alternate ceramic tape layers and internal electrode layers on said first laminate at said first location, and forming a dummy portion comprising only ceramic tape layers on said first laminate at said second location;
    C) etching said first laminate, said second laminate and said dummy portion to form first and second capacitor stacks at said first and second locations;
    D) firing said first and second capacitor stacks integrally;
    E) forming first and second pairs of external electrodes on said first and second capacitor stacks, respectively;
    wherein said internal electrode layers carry the patterns of internal electrodes for said first and second capacitors at said first and second locations; said dummy portion at said second location does not comprise any internal electrode layers; and, said first laminate is closer to said substrate than said dummy portion.

2. The method according to claim 1, wherein said first capacitor does not comprise any dummy portion.

3. The method according to claim 1, wherein the thickness of said dummy portion is at least twice as much as a largest distance between adjacent ones of said internal electrodes in said second capacitor.

4. The method according to claim 1, wherein each internal electrode of said second capacitor is co-planar with a selected one of the internal electrodes of said first capacitor.

5. The method according to claim 1, further comprising a structural material surrounding and physically contacting the side surfaces of said first and second capacitors, wherein said structural material mechanically interconnects in a spaced, planar relation said first and second capacitors.

6. A method for making a three-dimensional (3-D) module including first and second capacitors at first and second locations on a substrate, comprising the steps of:
   A) forming a first laminate of alternate ceramic tape layers and internal electrode layers at said first and second locations on said substrate;
   B) forming a second laminate of alternate ceramic tape layers and internal electrode layers on said first laminate at said first location, and forming a dummy portion comprising only ceramic tape layers on said first laminate at said second location;
   C) forming a third laminate of alternate ceramic tape layers and internal electrode layers at said first and second locations on said second laminate and said dummy portion;
   D) etching said first laminate, said second laminate, said dummy portion and said third laminate to form first and second capacitor stacks at said first and second locations;
   E) firing said first and second capacitor stacks integrally;
   F) forming first and second pairs of external electrodes on said first and second capacitor stacks, respectively;
   wherein said internal electrode layers carry the patterns of internal electrodes for said first and second capacitors at said first and second locations; said dummy portion at said second location does not comprise any internal electrode layers; said first laminate is closer to said substrate than said dummy portion; and, said dummy portion is closer to said substrate than said third laminate.

7. The method according to claim 6, wherein said first capacitor does not comprise any dummy portion.

8. The method according to claim 6, wherein the thickness of said dummy portion is at least twice as much as a largest distance between adjacent ones of said internal electrodes in said second capacitor.

9. The method according to claim 6, wherein each internal electrode of said second capacitor is co-planar with a selected one of the internal electrodes of said first capacitor.

10. The method according to claim 6, further comprising a structural material surrounding and physically contacting the side surfaces of said first and second capacitors, wherein said structural material mechanically interconnects in a spaced, planar relation said first and second capacitors.

* * * * *